(12) United States Patent
Yoshihara

(10) Patent No.: US 12,058,843 B2
(45) Date of Patent: Aug. 6, 2024

(54) MEMORY SYSTEM AND LABEL COMPONENT

(71) Applicant: Kioxia Corporation, Tokyo (JP)

(72) Inventor: Yoshiaki Yoshihara, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/306,891

(22) Filed: Apr. 25, 2023

(65) Prior Publication Data

US 2023/0269914 A1 Aug. 24, 2023

Related U.S. Application Data

(63) Continuation of application No. 17/463,447, filed on Aug. 31, 2021, now Pat. No. 11,672,102.

(30) Foreign Application Priority Data

Mar. 23, 2021 (JP) .................... 2021-048945

(51) Int. Cl.
*H05K 7/20* (2006.01)
*G06F 1/20* (2006.01)
*G11C 5/04* (2006.01)

(52) U.S. Cl.
CPC ............. *H05K 7/205* (2013.01); *G06F 1/203* (2013.01); *G11C 5/04* (2013.01)

(58) Field of Classification Search
CPC ............... H01L 23/367; H01L 25/0657; H01L 2225/06589; H01L 23/373;

(Continued)

(56) References Cited

U.S. PATENT DOCUMENTS 6,452,804 B1 9/2002 DiBene, II
8,149,583 B2 4/2012 Ishii
(Continued)

FOREIGN PATENT DOCUMENTS

CN 111491485 A 8/2020
JP 2007332293 A 12/2007
(Continued)

OTHER PUBLICATIONS

Satoshi Yoneda, "New SSD focused on stable high performance as a model using TLC NAND Samsung SSD 960 EVO (500GB capacity model)", 4Gamer, https://www.4gamer.net/games/999/G999902/20161115064/, Nov. 16, 2016, 29 pages (with translation).

(Continued)

*Primary Examiner* — Michael A Matey
(74) *Attorney, Agent, or Firm* — Kim & Stewart LLP

(57) ABSTRACT

According to one embodiment, a memory system includes a substrate, a first semiconductor device, a second semiconductor device, and a label. The first semiconductor device is on a first surface side of the substrate. The second semiconductor device is also on the first surface side of the substrate. The label has a first thermal conductive portion proximate to the first semiconductor device, a second thermal conductive portion proximate to the second semiconductor device, and an insulating portion that is between the first and second thermal conductive portions.

20 Claims, 14 Drawing Sheets

(58) Field of Classification Search
CPC ... H01L 2924/1434; G06F 1/20; G06F 1/203;
G06F 1/185; G06F 21/78; G06F 3/0679;
G06F 3/0688; G06F 2213/0032; H05K
2201/10159; H05K 1/144; H05K 1/181;
H05K 2201/042; H05K 1/0203; H05K
1/0204; H05K 1/141; H05K 2201/066;
H05K 1/0298; H05K 1/0201; H05K
7/209; H05K 7/20409; G11C 5/04; F28D
20/025
See application file for complete search history.

(56) References Cited

U.S. PATENT DOCUMENTS

| | | |
|---|---|---|
| 11,122,709 B2 | 9/2021 | Suzuki |
| 11,252,817 B1 | 2/2022 | Kimura |
| 11,317,540 B2 | 4/2022 | Hur |
| 11,387,224 B2 | 7/2022 | Xu |
| 2003/0156386 A1 | 8/2003 | Summers |
| 2008/0038877 A1 | 2/2008 | Wang |
| 2009/0283886 A1 | 11/2009 | Yamazaki |
| 2011/0012255 A1 | 1/2011 | Suganuma |
| 2011/0199748 A1 | 8/2011 | Kagawa |
| 2012/0326338 A1 | 12/2012 | Eguchi |
| 2014/0117528 A1 | 5/2014 | Byun |
| 2014/0146461 A1 | 5/2014 | Choi |
| 2014/0306335 A1 | 10/2014 | Mataya |
| 2016/0093550 A1 | 3/2016 | Kumagai |
| 2016/0268179 A1 | 9/2016 | Hiruta |
| 2016/0270205 A1 | 9/2016 | Kamimura |
| 2016/0270266 A1 | 9/2016 | Ozawa |
| 2016/0293513 A1 | 10/2016 | Hiruta |
| 2017/0023970 A1 | 1/2017 | Kimura |
| 2018/0024600 A1 | 1/2018 | Horiuchi |
| 2018/0203491 A1 | 7/2018 | Kim |
| 2019/0174618 A1 | 6/2019 | Chen |
| 2019/0174638 A1* | 6/2019 | Silvano de Sousa ........................ H05K 3/4608 |
| 2021/0272885 A1 | 9/2021 | Arrington |
| 2021/0298163 A1 | 9/2021 | Yoshihara |
| 2021/0320049 A1 | 10/2021 | Suzuki |
| 2022/0312627 A1 | 9/2022 | Yoshihara |

FOREIGN PATENT DOCUMENTS

| | | |
|---|---|---|
| JP | 2018018853 A | 2/2018 |
| JP | 2019167155 A | 10/2019 |

OTHER PUBLICATIONS

Hideo Ishii, "[Detailed report] Samsung's new SSD 960 PRO/EVO will be released in October. The price is also clear", PC Watch, https://pc.watch.impress.co.jp/docs/news/1021285.html, Sep. 21, 2016, 15 pages (with translation).

Samsung SSD 960 EVO M.2, Data Sheet Rev. 1.2, Oct. 2017, 4 pages.

* cited by examiner

MEMORY SYSTEM AND LABEL COMPONENT

CROSS-REFERENCE TO RELATED APPLICATIONS

This application is a continuation of U.S. patent application Ser. No. 17/463,447, filed on Aug. 31, 2021, which is based upon and claims the benefit of priority from Japanese Patent Application No. 2021-048945, filed on Mar. 23, 2021, the entire contents of each of which are incorporated herein by reference.

FIELD

Embodiments described herein relate generally to a memory system and a label component.

BACKGROUND

Various electronic components can be mounted on or adjacent to solid-state drives (SSDs). The mounted electronic components generate heat during the SSD operations. It is thus required to dissipate the heat generated by the electronic components. In many instances, a label such as a plastic or resin label may be attached to a surface of a component mounted on an SSD. Generally, such labels will have low heat conductivity, so their heat dissipation performance will be low.

DETAILED DESCRIPTION

Embodiments provide a memory system and a label component having improved heat dissipation performance.

In general, according to one embodiment, a memory system includes a first substrate having a first surface. A first semiconductor device is on the first surface side of the first substrate in a first area. A second semiconductor device is on the first surface side of the first substrate in a second area that is spaced from the first area in a first direction. A label has a first thermal conductive portion that is adjacent to the first semiconductor device, a second thermal conductive portion that is adjacent to the second semiconductor device, and a thermal insulating portion that is between the first thermal conductive portion and the second thermal conductive portion in the first direction.

Certain example embodiments will be described with reference to the drawings. In the specification and drawings, repeated or substantially similar elements, aspects, or components are designated using the same reference symbols and the description of such repeated or substantially similar elements, aspects, or components may be omitted from description for subsequent drawings and/or embodiments. In general, the drawings are schematic and not intended to reflect actual scale or dimensions. The example embodiments are provided for describing certain technical concepts and the like of the present disclosure of devices and methods. The details and specifics of these example embodiments may be modified in various ways and still remain within the scope of the present disclosure.

Label Component

Figure 1A:
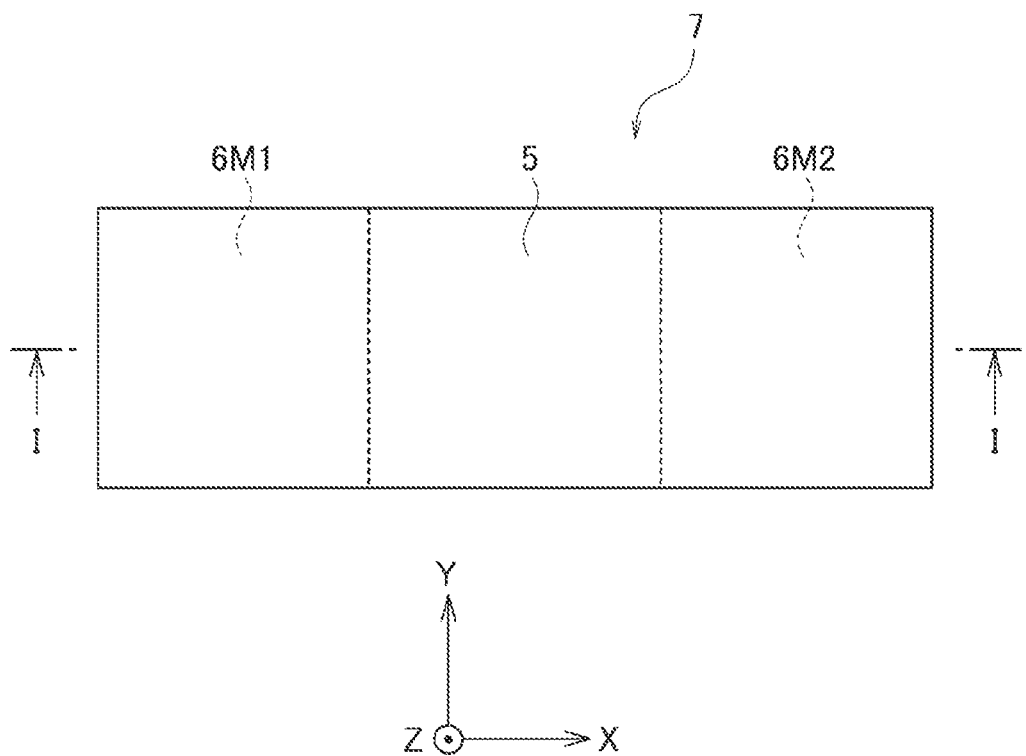
FIG. 1A is a plan view showing an example of a label component according to an embodiment.
Figure 1B:
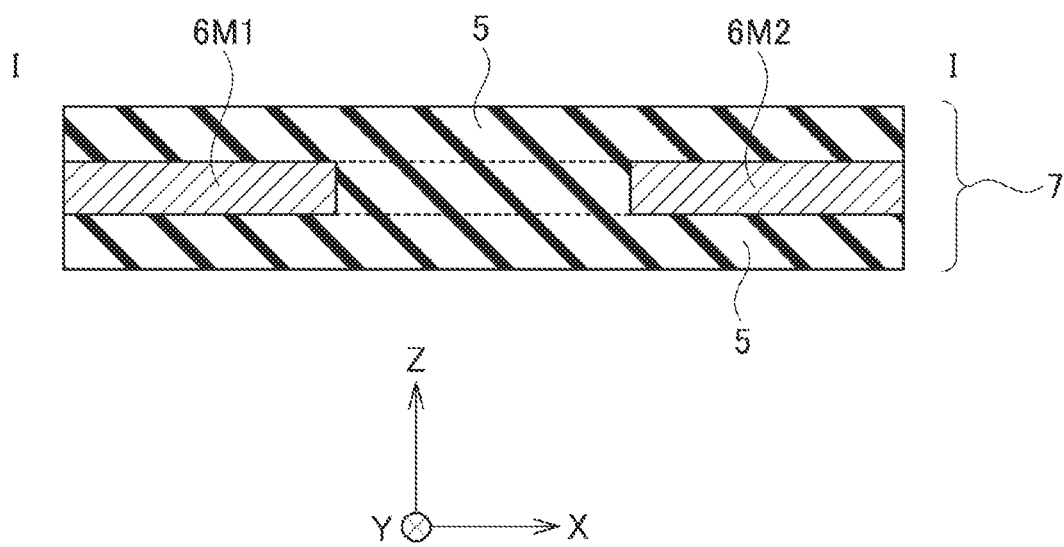
FIG. 1B is a cross-sectional view of a label component taken along the line I-I in FIG. 1A.

FIG. 1A is a plan view showing an example of a label component 7 according to an embodiment. FIG. 1B is a cross-sectional view of the label component 7 taken along the line I-I in FIG. 1A. As shown in FIG. 1A, the label component 7 extends in the X-Y plane. The X direction is the longitudinal direction (length dimension) of the label component 7, the Y direction is the lateral direction (width dimension) of the label component 7, and the Z direction is a thickness direction that is perpendicular to the X-Y plane.

As shown in FIGS. 1A and 1B, the label component 7 includes a first high heat conductive member 6M1, a second high heat conductive member 6M2, and a low heat conductive member 5. For a first portion of the label component 7, heat generated by a semiconductor device or the like to which label component 7 can be attached is conducted away by the first high heat conductive member 6M1. For a second portion of the label component 7, heat generated by the semiconductor device or the like to which label component 7 can be attached is conducted away by the second high heat conductive member 6M2. A portion of the low heat conductive member 5 is disposed between the first high heat conductive member 6M1 and the second high heat conductive member 6M2 and thus prevents or reduces heat conduction between the first area and the second area. That is, the presence of a portion of the low heat conductive member 5 limits heat conduction between the first high heat conductive member 6M1 and the second high heat conductive member 6M2.

As shown in FIG. 1B, there is a part (e.g. the middle part) of the low heat conductive member 5 which is not overlapped by the first high heat conductive member 6M1 or the second high heat conductive member 6M2 in the Z direction. Other parts (e.g., end parts) of the low heat conductive member 5 overlap with the first high heat conductive member 6M1 or the second high heat conductive member 6M2 in the Z direction. The first high heat conductive member 6M1 and the second high heat conductive member 6M2 are stacked (laminated) with the low heat conductive member 5. The first high heat conductive member 6M1 and the second high heat conductive member 6M2 may instead be formed by being embedded in the low heat conductive member 5.

The label component 7 configured in this way has a different heat conductivity in different areas. A heat conductivity of the first high heat conductive member 6M1 and a heat conductivity of the second high heat conductive member 6M2 are both higher than a heat conductivity of the low heat conductive member 5. The label component 7 has different heat conduction characteristics for the different areas, which may be positioned to correspond to the positionings of a plurality of semiconductor devices on a substrate or the like.

The first high heat conductive member 6M1 is an example of a first portion, the second high heat conductive member 6M2 is an example of a second portion, and a middle part of the low heat conductive member 5 is an example of a third portion.

The first high heat conductive member 6M1 and the second high heat conductive member 6M2 are made of, for example, a metal layer or a conductive polymer. As a metal layer, a material comprising a metal having good heat conduction characteristics, such as copper (Cu), aluminum (Al), molybdenum (Mo), and tungsten (W), may be utilized. As a conductive polymer, a polythiophene-based or polyaniline-based polymer film having good stability, good film-forming properties, and transparency may be utilized.

The low heat conductive member 5 is made of an insulating material that prevents (substantially reduces) heat conduction between the first high heat conductive member 6M1 and the second high heat conductive member 6M2. The insulating material may be made of a polyethylene terephthalate (PET) resin, which is a thermoplastic polyester obtained by polycondensing terephthalic acid or dimethyl terephthalate with ethylene glycol, an acrylic adhesive, an epoxy adhesive, a silicone resin, or the like. Furthermore, the low heat conductive member 5 may be formed as a stacked structure (multiple layers) of the insulating materials described above. Further, the stacked structure of the insulating materials may be provided with a layer suitable for printing characters or images thereon. Further, the label component 7 may be flexible.

The label component 7 is formed by, for example, stacking an insulating material with an adhesive or the like, or by vapor deposition.

First Embodiment

Figure 2A:
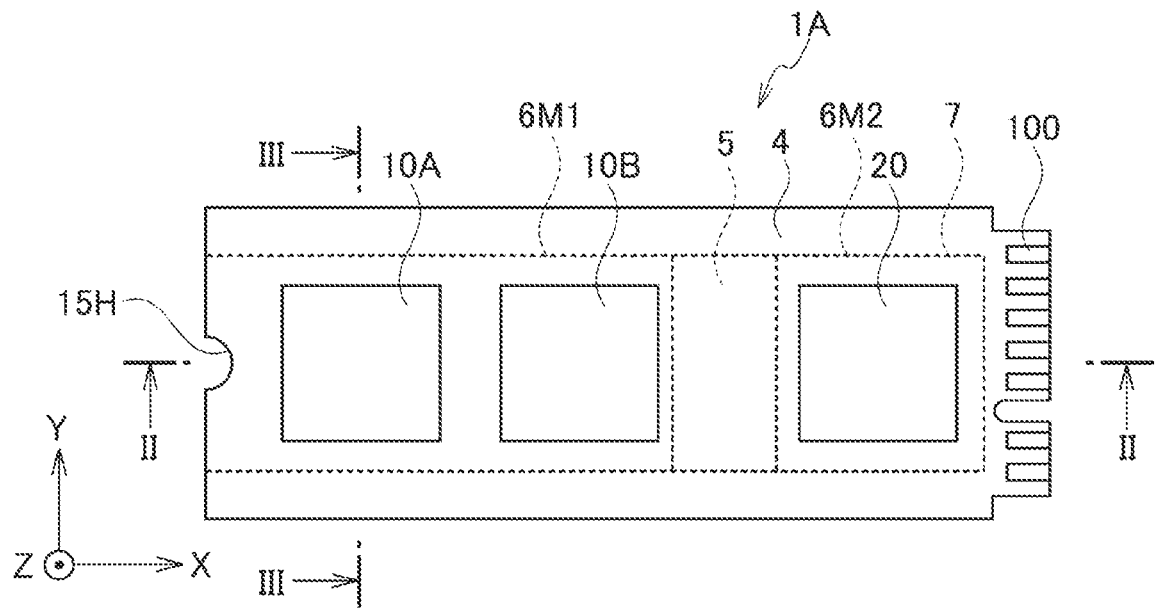
FIG. 2A is a plan view of a memory system according to a first embodiment.
Figure 2B:
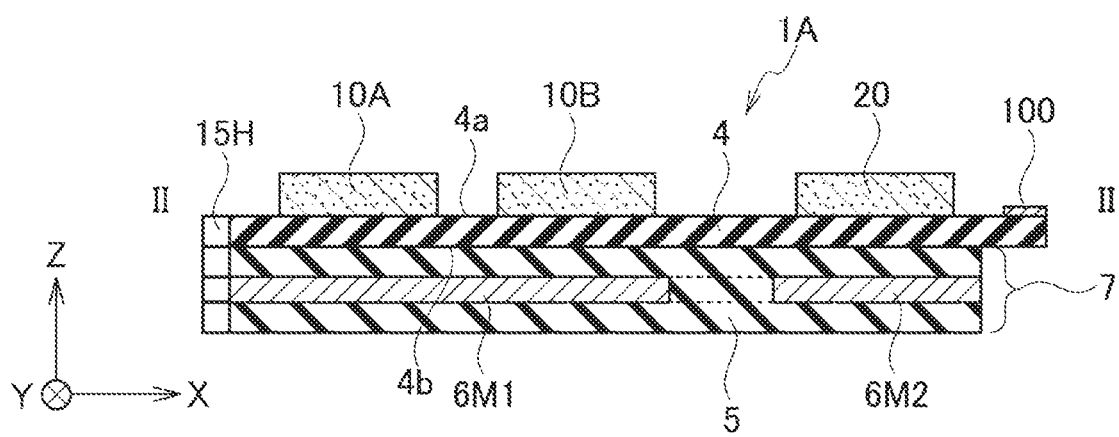
FIG. 2B is a cross-sectional view of a memory system according to a first embodiment taken along the line II-II in FIG. 2A.
Figure 2C:
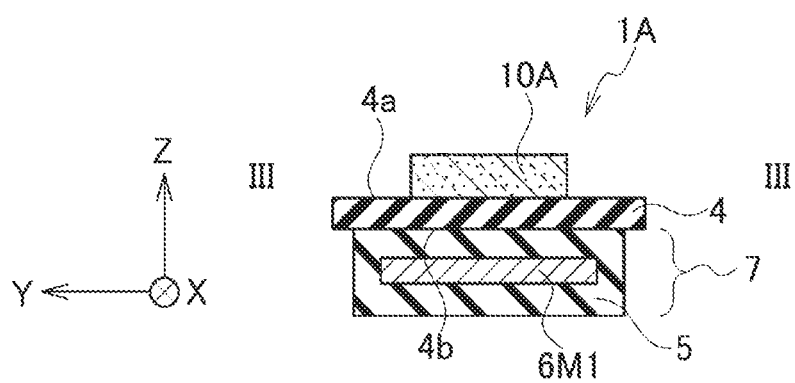
FIG. 2C is a cross-sectional view of a memory system according to a first embodiment taken along the line III-III in FIG. 2A.

FIG. 2A is a plan view of a memory system 1A according to a first embodiment. Further, FIG. 2B is a cross-sectional view of the memory system 1A taken along the line II-II in FIG. 2A. Further, FIG. 2C is a cross-sectional view of the memory system 1A taken along the line III-III in FIG. 2A.

The memory system 1A according to the first embodiment includes a first substrate 4, first semiconductor devices 10A and 10B, a second semiconductor device 20, and a label component 7.

The first substrate 4 includes a connector portion 100 and a groove portion 15H. The groove portion 15H is provided at one end of the first substrate 4 in the X direction. The connector portion 100 is provided at the other end of the first substrate 4 separated from the groove portion 15H in the X direction.

The first substrate 4 is, for example, a circuit substrate such as a printed wiring substrate or printed circuit board. The first substrate 4 has a first surface 4a and a second surface 4b opposite to the first surface 4a. As shown in FIG. 2A, the first substrate 4 extends in the X-Y plane. The X direction is the longitudinal (length dimension) direction of the first substrate 4, the Y direction is the lateral (width dimension) direction of the first substrate 4, and the Z direction is a direction perpendicular to the X-Y plane (a thickness dimension direction). T As shown in FIG. 2B, the first semiconductor devices 10A and 10B are disposed on the first surface 4a side of the first substrate 4.

The first semiconductor devices 10A and 10B are, for example, NAND flash memories. In the following description, the first semiconductor devices 10A and 10B will also be referred to as NAND flash memories 10A and 10B. The NAND flash memories 10A and 10B have a first operation allowable temperature T1.

The second semiconductor device 20 is disposed on the first surface 4a side of the first substrate 4. The second semiconductor device 20 is, for example, a memory controller that controls the NAND flash memories 10A and 10B. In the following description, the second semiconductor device 20 will also be referred to as a memory controller 20. Generally, the memory controller 20 has a second operation allowable temperature T2 that is higher than the first operation allowable temperature T1.

As described above, the label component 7 has the first high heat conductive member 6M1, a second high heat conductive member 6M2, and a low heat conductive member 5. The first high heat conductive member 6M1 conducts the heat generated by the NAND flash memories 10A and 10B. The second high heat conductive member 6M2 conducts the heat generated by the memory controller 20. A part of the low heat conductive member 5 limits the heat conduction between the heat generated by the NAND flash memories 10A and 10B and the heat generated by the memory controller 20. As described above, the label component 7 thus has a different heat conductivity for different portions.

In the memory system 1A according to the first embodiment, the label component 7 is disposed on the second surface 4b side of the first substrate 4 as shown in FIGS. 2B and 2C.

As shown in FIGS. 2B and 2C, the first high heat conductive member 6M1 is disposed below the NAND flash memories 10A and 10B with the first substrate 4 interposed therebetween.

The second high heat conductive member 6M2 is disposed below the memory controller 20 with the first substrate 4 interposed therebetween.

The memory system 1A according to the first embodiment includes a label component 7 that has a structure having a different heat conductivity in different areas. As a result, in the memory system 1A, the heat generated by memory controller 20 is primarily diffused away by the second high heat conductive member 6M2. In the memory system 1A, in the area where the NAND flash memories 10A and 10B are disposed, the low heat conductive member 5 reduces the heat received from the second high heat conductive member 6M2, and the heat NAND flash memories 10A and 10B is thus primarily diffused away via the first high heat conductive member 6M1.

Memory System Mounting Structure

Figure 3:
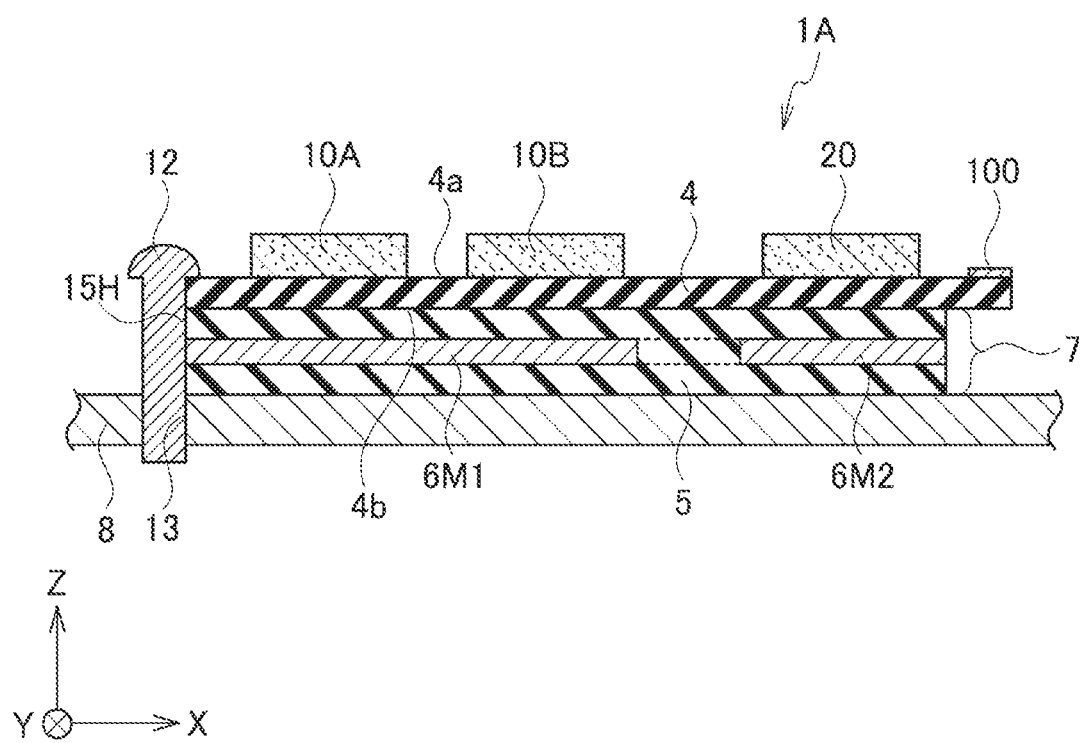
FIG. 3 is a cross-sectional view depicting a memory system according to a first embodiment mounted on a second substrate.

FIG. 3 is a cross-sectional view of a state in which the memory system 1A according to the first embodiment is mounted on a host device.

When the memory system 1A is connected to the host device via the connector portion 100, the memory system 1A can communicate with the host device via the connector portion 100. In a state where the memory system 1A is connected to the host device via the connector portion 100, the memory system 1A may be further connected to the host device via the groove portion 15H. The host device includes a connector or the like that can be connected to the connector portion 100 and a second substrate 8. The connector of the host device can be mounted on the second substrate 8. The second substrate 8 is, for example, a printed circuit substrate, a printed circuit board or the like. The second substrate 8 may be, in some examples, a metal plate.

As shown in FIG. 3, the memory system 1A is attached to the second substrate 8 with a metal screw 12 via the groove portion 15H. The metal screw 12 connects the first substrate 4 and the second substrate 8 via the groove portion 15H provided on the first substrate 4 and a thread cutting 13 provided on the second substrate 8. A part of the first high heat conductive member 6M1 is exposed at an inner wall of a part of the label component 7 corresponding to the groove portion 15H. A part of a wiring that becomes a reference potential (ground potential) wiring (ground wire) of the host device is exposed at an inner wall of the thread cutting 13.

In this way, the first high heat conductive member 6M1 of the label component 7 is thermally connected to the second substrate 8 via the metal screw 12.

The memory system 1A is connected to the connector mounted on the second substrate 8 via the connector portion 100. When the connector that is mounted on the second substrate 8 includes a high heat conductive member, the connector and the label component 7 can be in good thermal contact with each other.

The memory system 1A according to the first embodiment can propagate the heat generated by the NAND flash memories 10A and 10B to the second substrate 8 via the first high heat conductive member 6M1 and the metal screw 12. The heat generated by the memory controller 20 may be propagated from the connector portion 100 to the outside via the second high heat conductive member 6M2. That is, the heat generated by the NAND flash memories 10A and 10B is propagated to the label component 7 having the first high heat conductive member 6M1. The heat propagated to the label component 7 is transmitted to the second substrate 8 via the metal screw 12 that contacts the label component 7. The heat generated by the memory controller 20 is radiated by the second substrate. That is, the heat generated by the controller 20 is propagated to the label component 7 via the second high heat conductive member 6M2. Regarding the heat propagated to the label component 7, the heat is transmitted to the second substrate 8 via the contact with the label component 7 or the connector mounted on the second substrate 8. Heat propagation from the NAND flash memories 10A and 10B via the first high heat conductive member 6M1 to the memory controller 20 via the second high heat conductive member 6M2, is limited by the presence of a part of the low heat conductive member 5 interposed between the first high heat conductive member 6M1 and the second high heat conductive member 6M2.

The memory system 1A according to the first embodiment conforms to, for example, the M.2 standard, which is a standard for a built-in expansion card of a computer. The first substrate 4 of the memory system 1A has, for example, a width of 22 mm in the Y direction and a length that is substantially equal to 30 mm, 42 mm, 80 mm, or 110 mm in the X direction according to the M.2 standard. In this case, the label component 7 may have a width in the Y direction that is substantially equal to 20 mm and a length in the X direction that is substantially equal to 28 mm, 40 mm, 75 mm, or 100 mm.

Effects of First Embodiment

According to the first embodiment, the structure having a label component 7 attached to the second surface 4b of the first substrate 4 makes it possible to improve removal of the generated heat and/or to prevent the undesirable propagation of heat so as to provide the memory system 1A with improved heat dissipation performance.

The memory system 1A of the first embodiment includes first semiconductor devices 10A and 10B having a first operation allowable temperature T1, a second semiconductor device 20 having a second operation allowable temperature T2, and a label component 7. The temperatures for the first semiconductor devices 10A and 10B and the second semiconductor device 20, which have different device structures, may be differently controlled by adjusting positioning and thermal connection points of the first high heat conductive member 6M1 and the second high heat conductive member 6M2 in the label component 7.

Second Embodiment

Figure 4A:
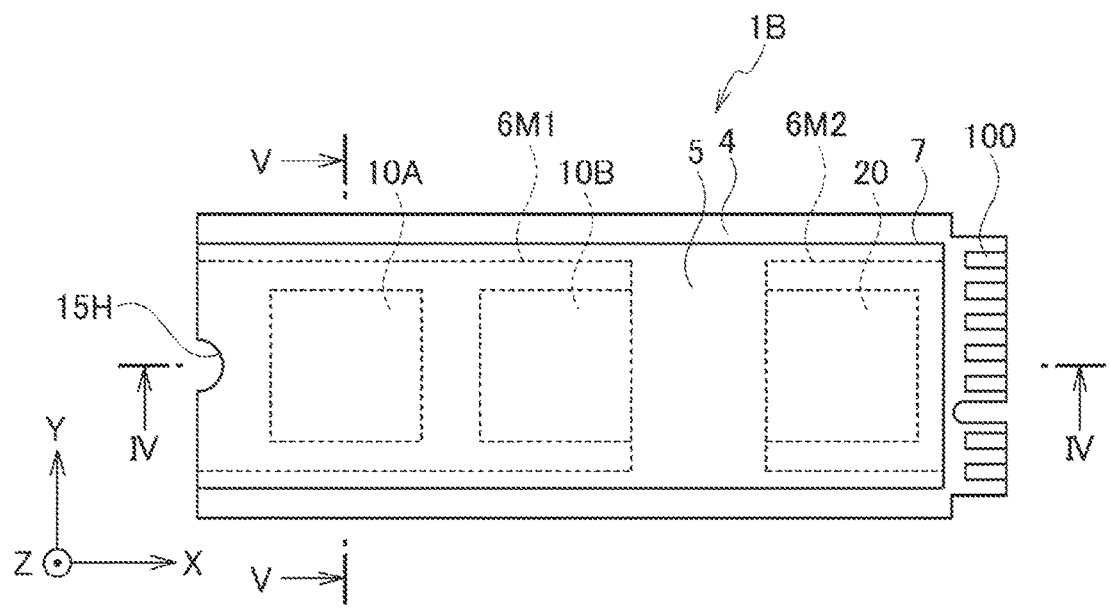
FIG. 4A is a plan view of a memory system according to a second embodiment.
Figure 4B:
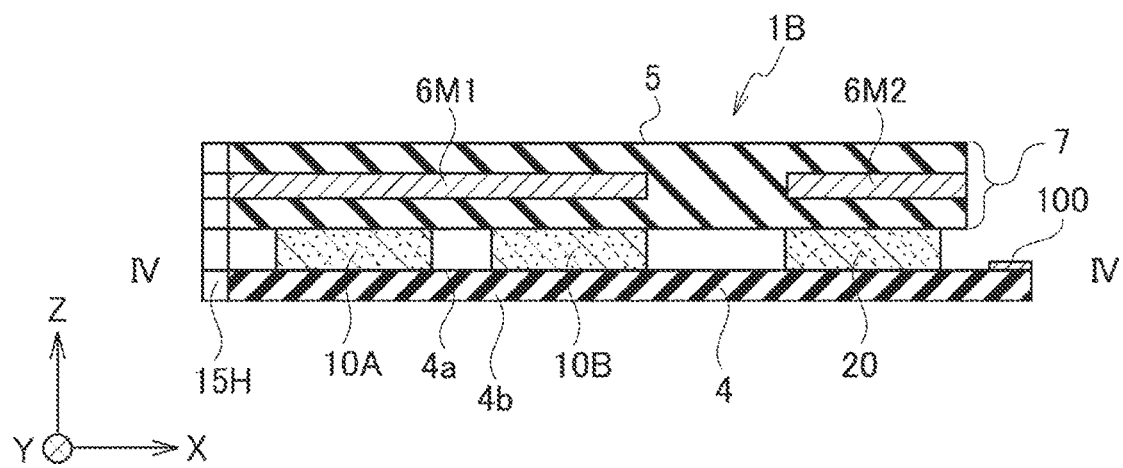
FIG. 4B is a cross-sectional view a memory system according to a second embodiment taken along the line IV-IV in FIG. 4A.

FIG. 4A is a plan view of a memory system 1B according to a second embodiment. FIG. 4B is a cross-sectional view of the memory system 1B taken along the line IV-IV in FIG. 4A. Further, FIG. 4C is a cross-sectional view of the memory system 1B taken along the line V-V in FIG. 4A.

Similar to the first embodiment, the memory system 1B according to the second embodiment includes the first substrate 4, NAND flash memories 10A and 10B which are examples of the first semiconductor device, the memory controller 20 which is an example of the second semiconductor device, and the label component 7. In the memory system 1B, the label component 7 is disposed on the first surface 4a side of the first substrate 4, as shown in FIGS. 4B and 4C.

Figure 4C:
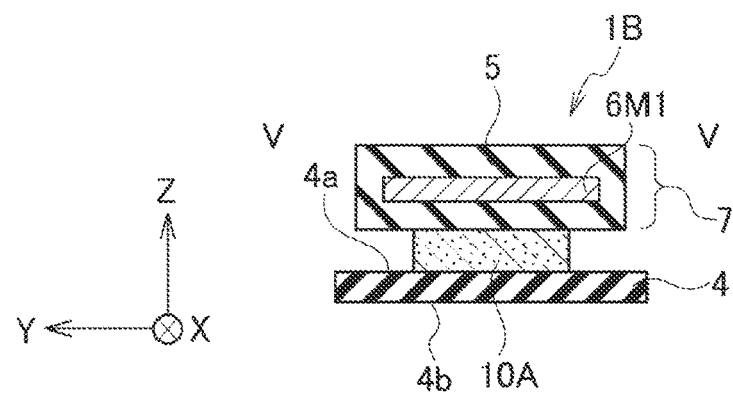
FIG. 4C is a cross-sectional view a memory system according to a second embodiment taken along the line V-V in FIG. 4A.

As shown in FIGS. 4B and 4C, the first high heat conductive member 6M1 is disposed above the NAND flash memories 10A and 10B.

The second high heat conductive member 6M2 is disposed above the memory controller 20.

The memory system 1B according to the second embodiment also includes the label component 7 having a different heat conductivity for different areas (regions). As a result, the heat from the memory controller 20 is primarily diffused away via the second high heat conductive member 6M2. From the area where the NAND flash memories 10A and 10B are disposed, the heat is primarily diffused away via the first high heat conductive member 6M1 since the low heat conductive member 5 reduces heat transfer between the first high heat conductive member 6M1 and the second the high heat conductive member 6M2.

Memory System Mounting Structure

Figure 5:
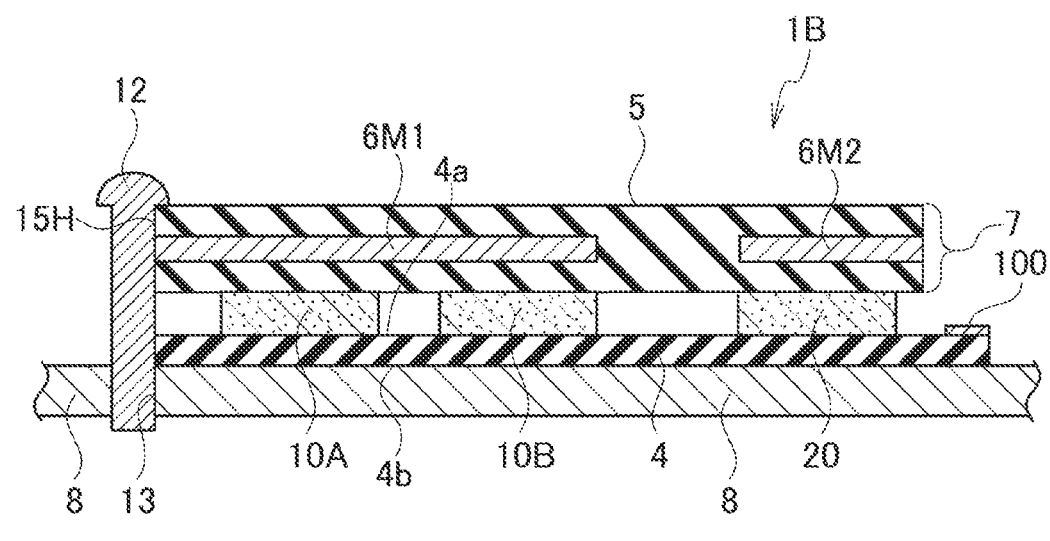
FIG. 5 is a cross-sectional view depicting a memory system according to a second embodiment mounted on a second substrate.

FIG. 5 is a cross-sectional view of a state in which the memory system 1B according to the second embodiment is mounted on the host device.

Similar to the first embodiment, the memory system 1B according to the second embodiment is connected to the host device via the connector portion 100 and can communicate with the host device. Further, the memory system 1B may be further connected to the host device via the groove portion 15H. The configuration of the host device is the same as that of the first embodiment.

As shown in FIG. 5, the memory system 1B is attached to the second substrate 8 with the metal screw 12 via the groove portion 15H. The metal screw 12 connects the first substrate 4 and the second substrate 8 via the groove portion 15H provided on the first substrate 4 of the memory system 1B and a thread cutting 13 provided on the second substrate 8. A part of the first high heat conductive member 6M1 is exposed at an inner wall of a part of the label component 7 corresponding to the groove portion 15H. Further, a part of a wiring that becomes a reference potential (ground potential) wiring (ground wire) of the host device is exposed at an inner wall of the thread cutting 13.

In this way, the first high heat conductive member 6M1 of the label component 7 is thermally connected to the second substrate 8 via the metal screw 12.

The memory system 1B is connected to the connector mounted on the second substrate 8 via the connector portion 100. As a result, the connector mounted on the second substrate 8 and the label component 7 are in contact with each other, and each of the connector and the label component 7 may be thermally connected.

The memory system 1B according to the first embodiment can propagate the heat generated by the NAND flash memories 10A and 10B to the second substrate 8 via the first high heat conductive member 6M1 and the metal screw 12. The heat generated by the memory controller 20 may be radiated from the upper portion thereof, the connector portion 100, or the like to the outside via the second high heat conductive member 6M2.

Effects of Second Embodiment

According to the second embodiment, the label component 7 attached to the first surface 4a of the first substrate 4 makes it possible to better transport away the generated heat so as to provide a memory system with improved heat removal performance.

Third Embodiment

Figure 6A:
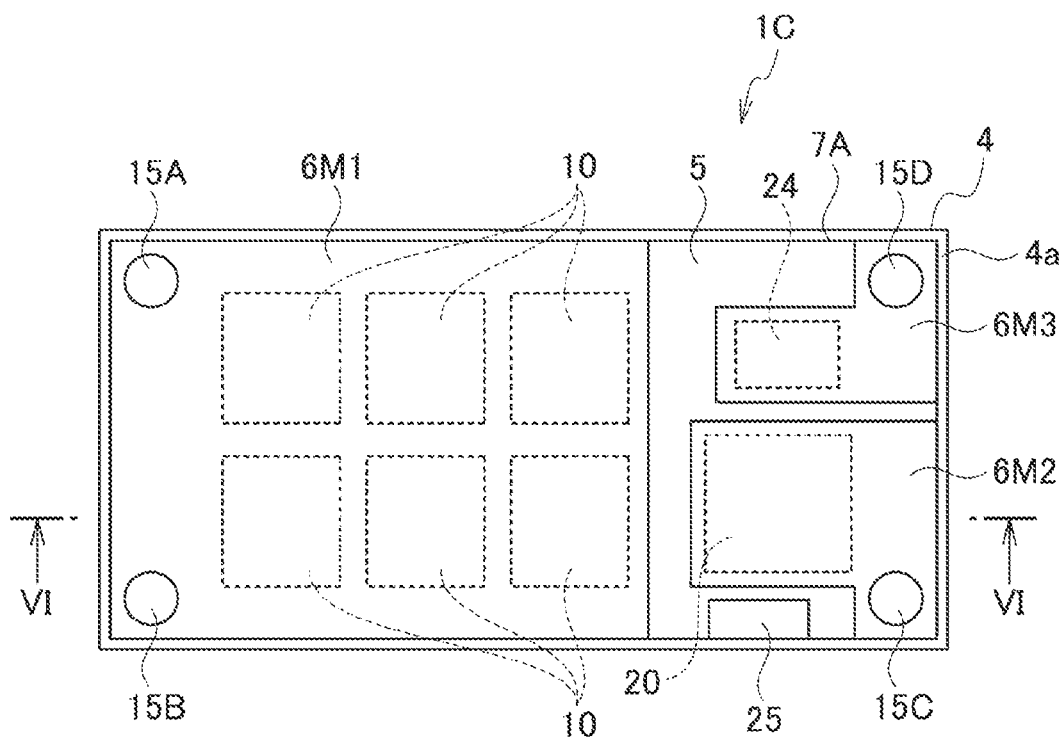
FIG. 6A is a plan view of a memory system according to a third embodiment.

FIG. 6A is a plan view of a memory system 1C according to a third embodiment. Further, FIG. 6B is a cross-sectional view of the memory system 1C taken along the line VI-VI in FIG. 6A.

As shown in FIG. 6A, the memory system 1C according to the third embodiment includes the first substrate 4, a plurality of first semiconductor devices 10, the second semiconductor device 20, a power management integrated circuit (PMIC) 24 for power, a dynamic random access memory (DRAM) 25, a label component 7A, and metal screws 15A to 15D.

Figure 6B:
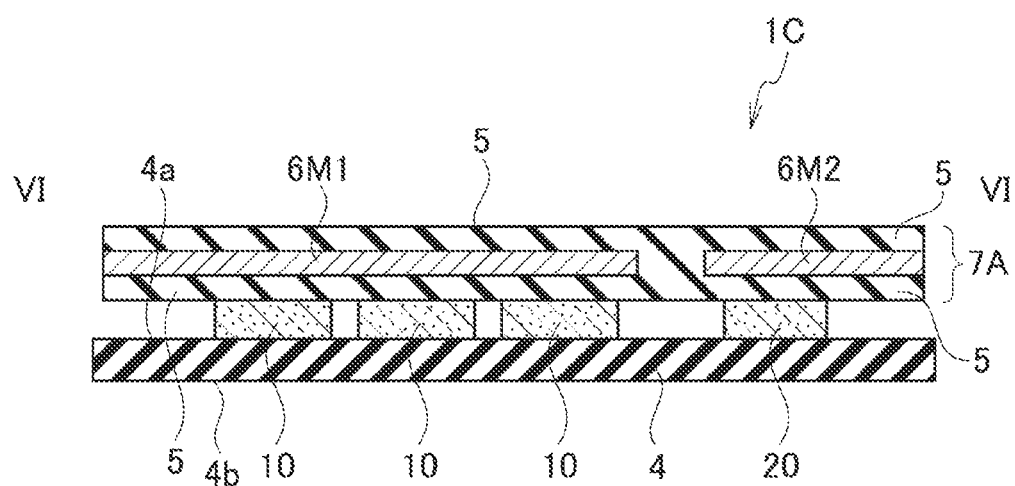
FIG. 6B is a cross-sectional view of a memory system according to a third embodiment taken along the line VI-VI in FIG. 6A.

As shown in FIG. 6B, the plurality of first semiconductor devices 10 are disposed on the first surface 4a side of the first substrate 4.

Each first semiconductor device 10 is, for example, a NAND flash memory. The first semiconductor device 10 has a first operation allowable temperature T1. In the following description, the first semiconductor device 10 will also be referred to as a NAND flash memory 10.

The second semiconductor device 20 is disposed on the first surface 4a side of the first substrate 4. The second semiconductor device 20 has a second operation allowable temperature T2 that is higher than the first operation allowable temperature T1.

The second semiconductor device 20 is a memory controller that controls each NAND flash memory 10. In the following description, the second semiconductor device 20 will also be referred to as a memory controller 20.

The PMIC 24 and the DRAM 25 are disposed on the first surface 4a side of the first substrate 4. The PMIC 24 supplies power to the first semiconductor device 10 and the second semiconductor device 20. The DRAM 25 is used as a work memory when the second semiconductor device 20 controls the first semiconductor device 10.

The label component 7A has a first high heat conductive member 6M1, a second high heat conductive member 6M2, a third high heat conductive member 6M3, and a low heat conductive member 5. The first high heat conductive member 6M1 transports the heat generated by the plurality of NAND flash memories 10. The second high heat conductive member 6M2 transports the heat generated by the memory controller 20. The third high heat conductive member 6M3 transports the heat generated by the PMIC 24. An interposed portion of the low heat conductive member 5 limits heat conduction between the NAND flash memory 10 and the memory controller 20. The low heat conductive member 5 also limits heat conduction between the NAND flash memory 10 and the PMIC 24. The label component 7A can thus have a different heat conductivity for different areas.

As shown in FIG. 6B, the label component 7A is disposed on the first surface 4a side of the first substrate 4. As shown in FIG. 6A or 6B, the first high heat conductive member 6M1 is disposed above the plurality of NAND flash memories 10. The second high heat conductive member 6M2 is disposed above the memory controller 20. The third high heat conductive member 6M3 is disposed above the PMIC 24.

Similar to the memory systems 1A and 1B, the memory system 1C according to the third embodiment includes the label component 7A that has a structure having a different heat conductivity for different areas. As a result, in the memory system 1C, the heat from the memory controller 20 is primarily diffused away via the second high heat conductive member 6M2. From the area where the NAND flash memories 10A and 10B are disposed, heat is primarily diffused away via the first high heat conductive member 6M1. From the area where the PMIC 24 is disposed, the heat is primarily diffused away via the third high heat conductive member 6M3.

Configuration Example of Memory System

Figure 6C:
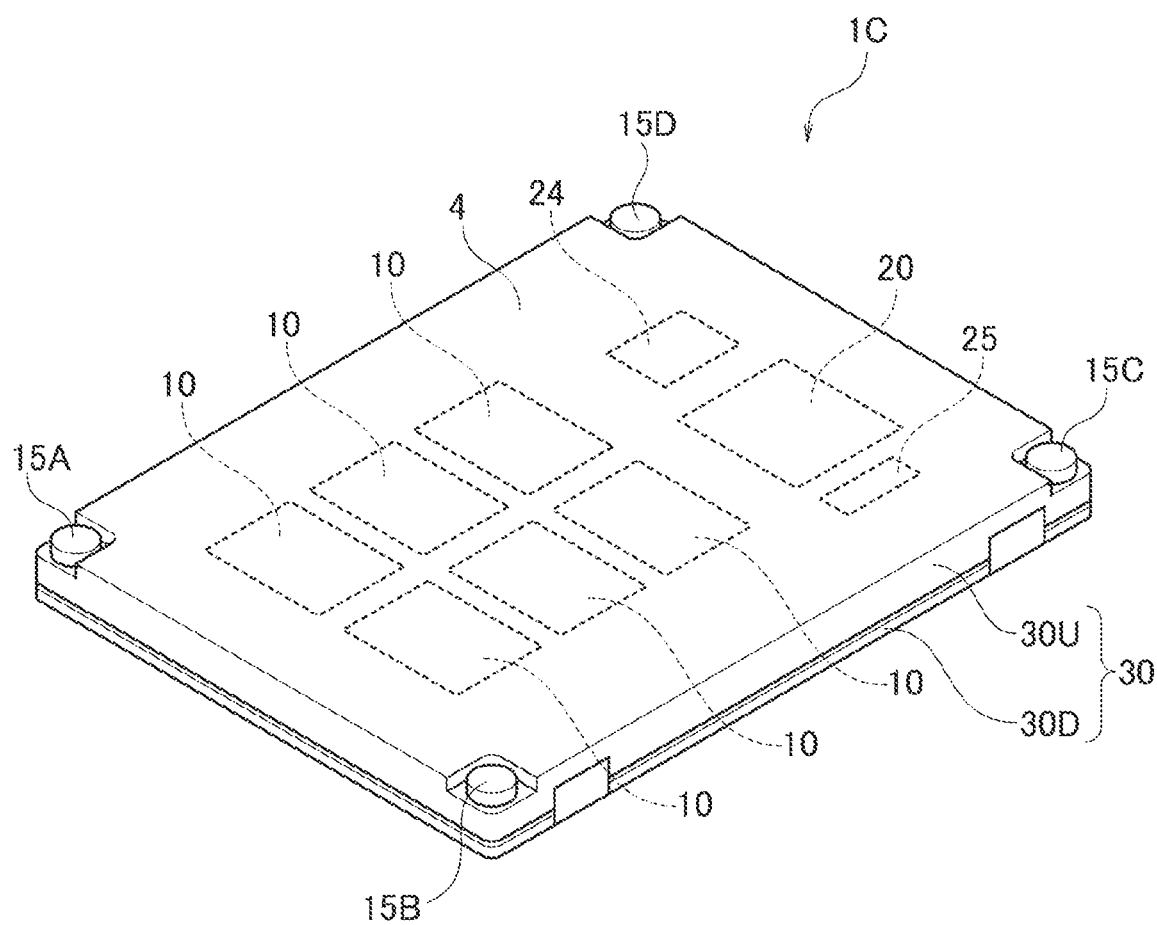
FIG. 6C is a perspective view showing an example of a memory system according to a third embodiment.

FIG. 6C is a perspective view showing an example of the memory system 1C according to the third embodiment. The memory system 1C is, for example, solid state drives (SSDs). The memory system 1C according to the third embodiment satisfies the form factor (FF) standard related to the shape of the 2.5-inch SSD. The memory system 1C includes a housing 30 formed of a first housing (upper housing) 30U and a second housing (lower housing) 30D.

As shown in FIG. 6A, the first high heat conductive member 6M1 is connected to the housing 30 via metal screws 15A and 15B.

The second high heat conductive member 6M2 is connected to the housing 30 via a metal screw 15C.

The third high heat conductive member 6M3 is connected to the housing 30 via a metal screw 15D.

The heat generated by the NAND flash memory 10, the memory controller 20, and the PMIC 24 of the memory system 1C is thermally propagated to other components of the memory system 1C, the first housing (upper housing) 30U, or the second housing (lower housing) 30D via the label component 7A, and ultimately radiated away or otherwise removed/withdrawn.

As a result, a temperature of the NAND flash memory 10 can be maintained in a temperature range suitable for operation, and good operation of the memory system 1C can be guaranteed. The layout of the NAND flash memory 10, the memory controller 20, the PMIC 24, and the DRAM 25 mounted on the first substrate 4 housed in the housing 30 is an example, and it can be appropriately changed according to the required memory capacitances, the size of the housing of the memory system 1C, or the like. Further, a plurality of first substrates 4 may be housed in the housing 30.

Effects of Third Embodiment

According to the third embodiment, a label component 7A attached to the first surface 4a of the first substrate 4 makes it possible to better remove the generated heat so as to provide the memory system with improved heat removal performance.

Fourth Embodiment

Figure 7A:
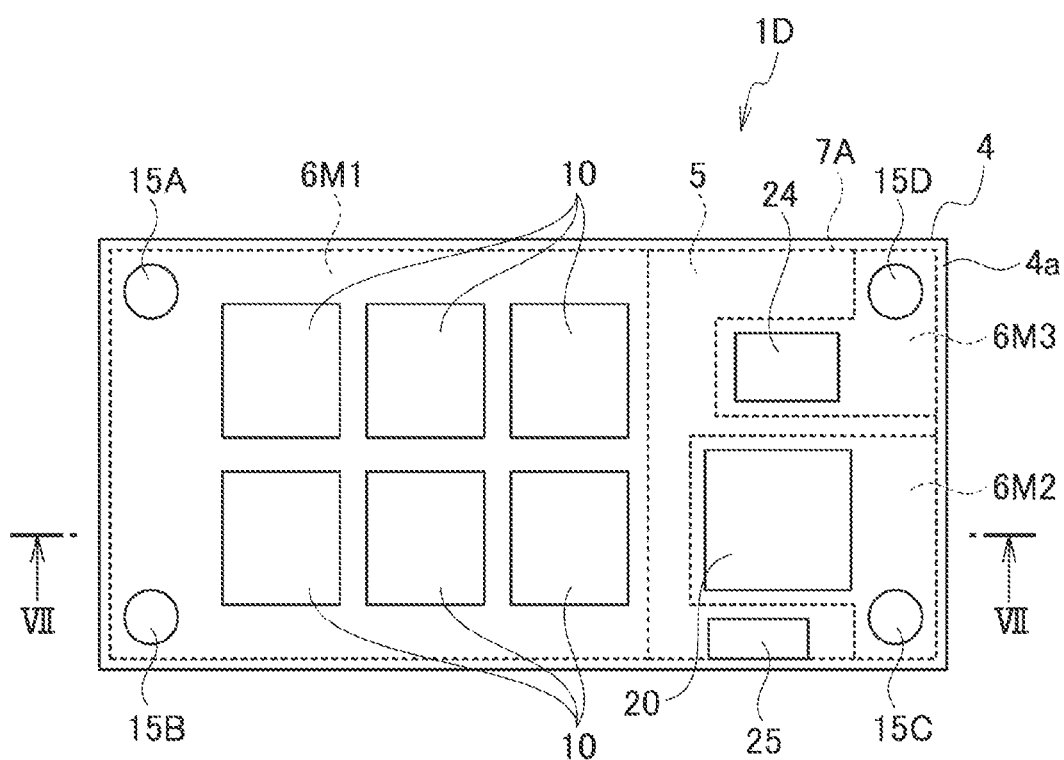
FIG. 7A is a plan view of a memory system according to a fourth embodiment.

FIG. 7A is a plan view of a memory system 1D according to a fourth embodiment. Further, FIG. 7B is a cross-sectional view of the memory system 1D taken along the line VII-VII in FIG. 7A.

The memory system 1D according to the fourth embodiment includes a first substrate 4, a first semiconductor device 10, a second semiconductor device 20, a PMIC 24, a DRAM 25, a label component 7A, and metal screws 15A to 15D.

Figure 7B:
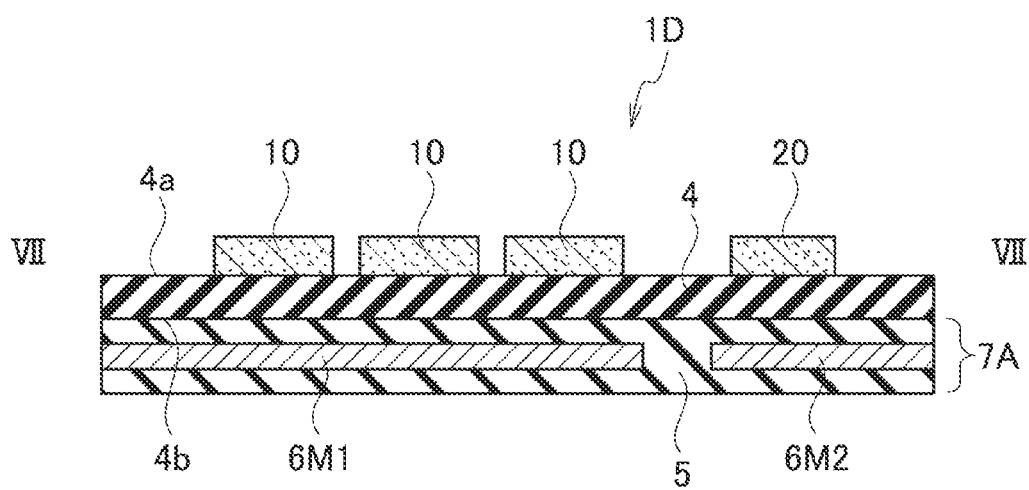
FIG. 7B is a cross-sectional view of a memory system according to a fourth embodiment taken along the line VII-VII in FIG. 7A.

As shown in FIG. 7B, the first semiconductor device 10 is disposed on the first surface 4a side of the first substrate 4.

Each first semiconductor device 10 includes, for example, a NAND flash memory. The first semiconductor device 10 has a first operation allowable temperature T1. In the following description, the first semiconductor device 10 will also be referred to as a NAND flash memory 10.

The second semiconductor device 20 is disposed on the first surface 4a side of the first substrate 4. The second semiconductor device 20 has a second operation allowable temperature T2 that is higher than the first operation allowable temperature T1.

The second semiconductor device 20 is a memory controller that controls each NAND flash memory 10. In the following description, the second semiconductor device 20 will also be referred to as a memory controller 20.

The PMIC 24 and the DRAM 25 are disposed on the first surface 4a side of the first substrate 4.

The label component 7A has a first high heat conductive member 6M1, a second high heat conductive member 6M2, a third high heat conductive member 6M3, and a low heat conductive member 5. The first high heat conductive member 6M1 diffuses the heat generated by the NAND flash memory 10. The second high heat conductive member 6M2 diffuses the heat generated by the memory controller 20. The third high heat conductive member 6M3 diffuses the heat generated by the PMIC 24. A part of the low heat conductive member 5 limits the heat conduction between the NAND flash memory 10 and the memory controller 20. Further, a part of the low heat conductive member 5 limits heat conduction between the NAND flash memory 10 and the PMIC 24. The label component 7A has a different heat conductivity for different areas.

As shown in FIG. 7B, the label component 7A is disposed on the side of the second surface 4b opposite to the first surface 4a of the first substrate 4.

As shown in FIG. 7B, the first high heat conductive member 6M1 is disposed below the plurality of NAND flash memories 10.

The second high heat conductive member 6M2 is disposed below the memory controller 20.

The third high heat conductive member 6M3 is disposed below the PMIC 24.

Similar to the memory systems 1A to 1C, a memory system 1D according to the fourth embodiment includes a label component 7A having a different heat conductivity for different areas. As a result, in the memory system 1D, the heat from memory controller 20 is primarily diffused via the second high heat conductive member 6M2. In the memory system 1D, the low heat conductive member 5 reduces the heat received from the second high heat conductive member 6M2 and the third high heat conductive member 6M3, and the heat from the NAND flash memories 10A and 10B is primarily diffused via the first high heat conductive member 6M1. The heat from the PMIC 24 is primarily diffused via the third high heat conductive member 6M3 since a portion of the low heat conductive member 5 separates the third high heat conductive member 6M3 from the other high heat conductive members (6M1, 6M2).

Similar to FIG. 6C, the memory system 1D according to the fourth embodiment may be an SSD device. The memory system 1D includes a housing 30 formed of a first housing (upper housing) 30U and a second housing (lower housing) 30D.

As shown in FIG. 7A, the first high heat conductive member 6M1 is connected to the housing 30 via metal screws 15A and 15B.

The second high heat conductive member 6M2 is connected to the housing 30 via a metal screw 15C.

The third high heat conductive member 6M3 is connected to the housing 30 via the metal screw 15D.

The heat generated by the NAND flash memory 10, the memory controller 20, and the PMIC 24, which are provided in the memory system 1D, is thermally propagated to other components of the memory system 1D, the first housing (upper housing) 30U, or the second housing (lower housing)

30D via the above-mentioned label component 7A, and radiated away or otherwise removed/withdrawn.

Effects of Fourth Embodiment

According to the fourth embodiment, the label component 7A attached to the second surface 4b of the first substrate 4 makes it possible to better remove generated heat so as to provide the memory system with improved heat removal performance.

Fifth Embodiment

Figure 8A:
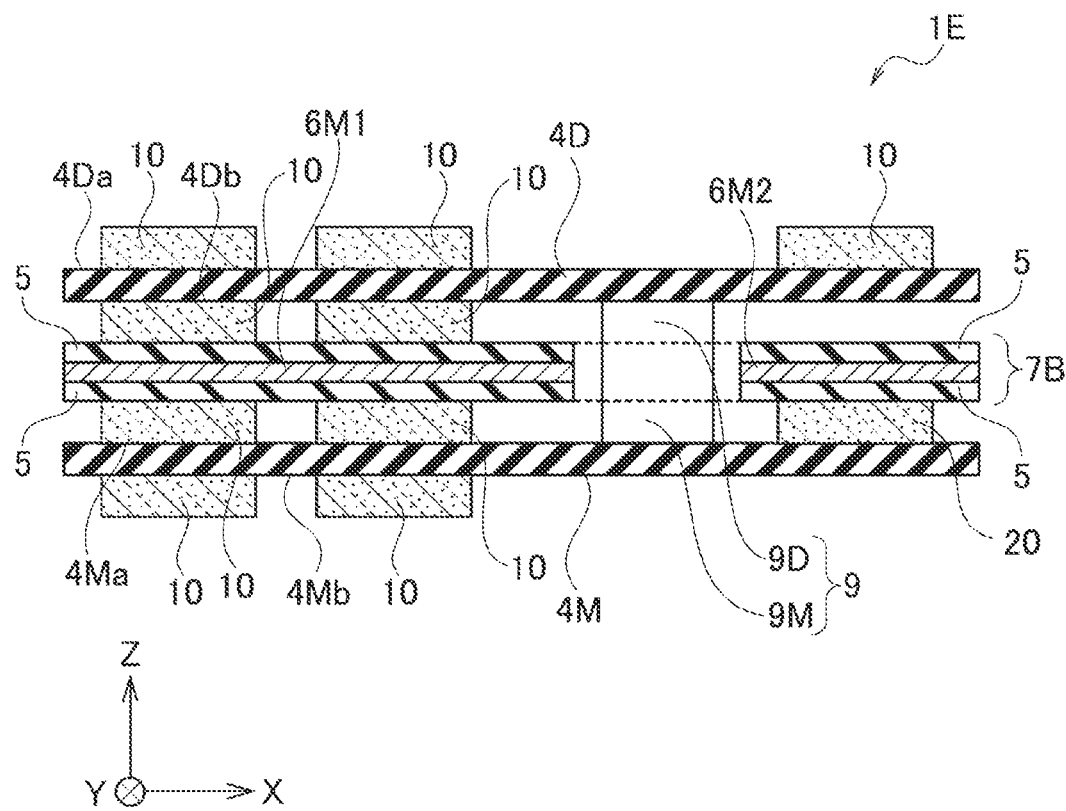
FIG. 8A is a cross-sectional view of a memory system according to a fifth embodiment.
Figure 8B:
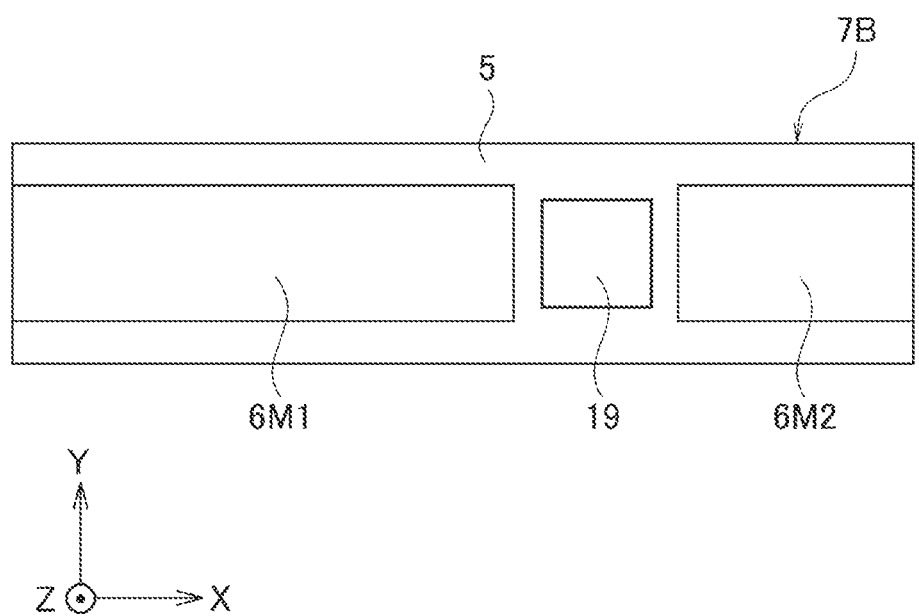
FIG. 8B is a plan view of a label component applied to a memory system according to a fifth embodiment.
Figure 8C:
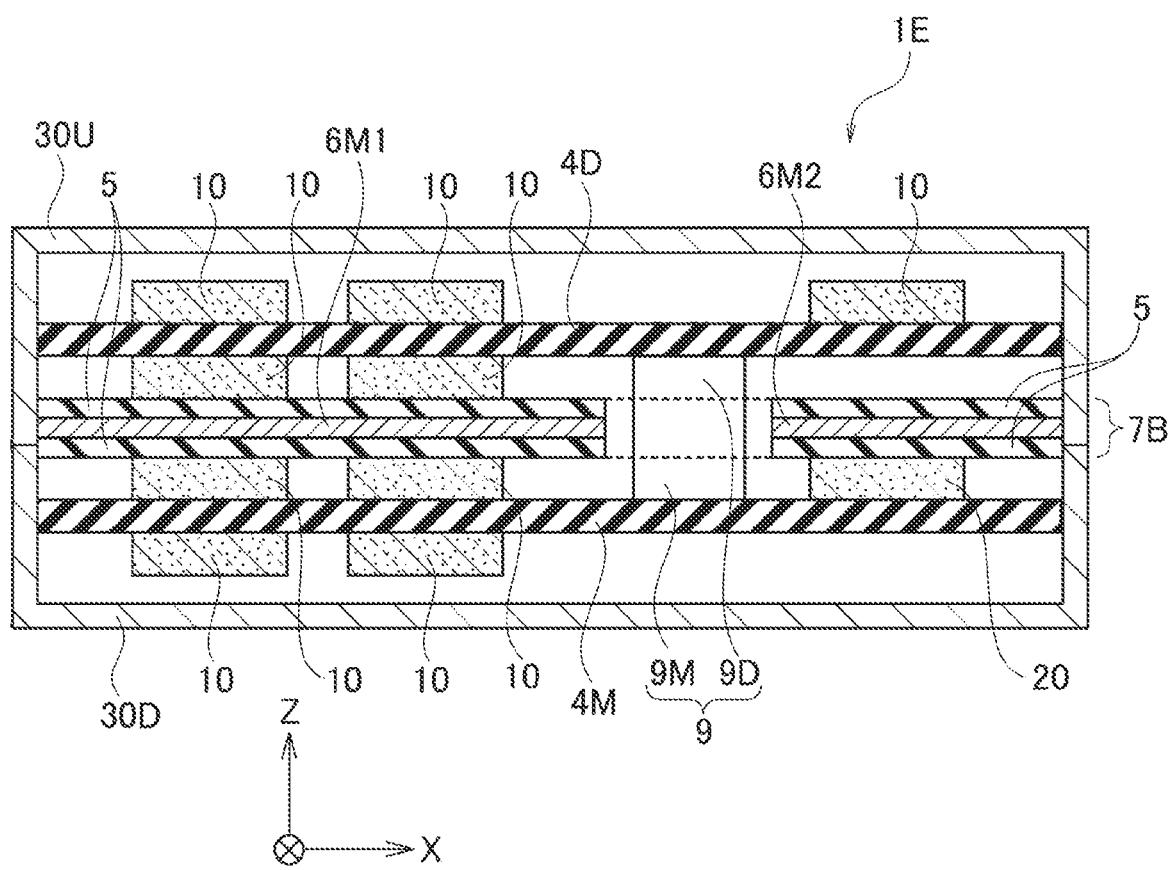
FIG. 8C is a cross-sectional view of a memory system according to a fifth embodiment configured as an SSD device.

FIG. 8A is a cross-sectional view of a memory system 1E according to a fifth embodiment. Further, FIG. 8B is a plan view of a label component 7B applied to the memory system 1E according to the fifth embodiment. Further, FIG. 8C is a cross-sectional view of the memory system 1E according to the fifth embodiment configured as an SSD device.

The memory system 1E according to the fifth embodiment includes a first substrate 4M and a first substrate 4D disposed above the first substrate 4M. The first substrate 4M may be called, for example, a motherboard, and the first substrate 4D may be called a daughterboard.

The first substrate 4M has a first surface 4Ma and a second surface 4Mb opposite to the first surface 4Ma. A plurality of NAND flash memories 10 and a memory controller 20 are disposed on the first surface 4Ma side of the first substrate 4M. A plurality of NAND flash memories 10 are disposed on the second surface 4Mb side of the first substrate 4M.

The first substrate 4D has a first surface 4Da and a second surface 4Db opposite to the first surface 4Da. A plurality of NAND flash memories 10 are disposed on the first surface 4Da side of the first substrate 4D, and a plurality of NAND flash memories 10 are also disposed on the second surface 4Db side of the first substrate 4D.

The label component 7B is disposed between the first substrate 4M and the first substrate 4D.

Connectors 9M and 9D for electrically connecting the first substrate 4M and the first substrate 4D are disposed between the first substrate 4M and the first substrate 4D. The connector 9M is disposed on the first surface 4Ma side of the first substrate 4M, and the connector 9D is disposed on the second surface 4Db side of the first substrate 4D.

The signal transmission between the plurality of NAND flash memories 10 disposed on the first substrate 4M and the memory controller 20 disposed on the first substrate 4D, and/or the power transmission between the first substrate 4M and the first substrate 4D can be performed via the connectors 9M and 9D.

The label component 7B has a first high heat conductive member 6M1, a second high heat conductive member 6M2, and a low heat conductive member 5. The label component 7B has a cavity portion 19 as shown in FIG. 8B. When the label component 7B is disposed between the first substrate 4M and the first substrate 4D, the connectors 9M and 9D are positioned to be in the cavity portion 19. The first high heat conductive member 6M1 diffuses the heat generated by the NAND flash memory 10. The second high heat conductive member 6M2 diffuses the heat generated by the memory controller 20.

As shown in FIG. 8A, the first high heat conductive member 6M1 is disposed above the NAND flash memory 10, which is disposed on the first surface 4Ma side of the first substrate 4M. As shown in FIG. 8A, the first high heat conductive member 6M1 is disposed below the NAND flash memory 10, which is disposed on the second surface 4Db side of the first substrate 4D.

As shown in FIG. 8A, the second high heat conductive member 6M2 is disposed above the memory controller 20, which is disposed on the first surface 4Ma side of the first substrate 4M. The second high heat conductive member 6M2 is disposed below the NAND flash memory 10, which is disposed on the first surface 4Da side of the first substrate 4D.

Configuration Example of Memory System

As shown in FIG. 8C, the memory system 1E includes a housing 30 formed of a first housing (upper housing) 30U and a second housing (lower housing) 30D.

A part of the first high heat conductive member 6M1 is in contact with the first housing (upper housing) 30U. A part of the second high heat conductive member 6M2 is in contact with the first housing (upper housing) 30U.

The heat generated by the NAND flash memory 10 and the memory controller 20, which are provided in the memory system 1E, is propagated to other components of the memory system 1E, the first housing (upper housing) 30U, or the second housing (lower housing) 30D via the above-mentioned label component 7B, and radiated away or otherwise removed/withdrawn.

As a result, the temperature of the NAND flash memory 10 can be maintained in a temperature range suitable for operation, and good operation of the memory system 1E can be guaranteed.

Effects of Fifth Embodiment

According to the fifth embodiment, the label component 7B attached between a plurality of first substrates (4D, 4M) makes it possible to better remove generated heat so as to provide the memory system with improved heat radiation performance.

Modification Example of Label Component

Modification Example 1

Figure 9:
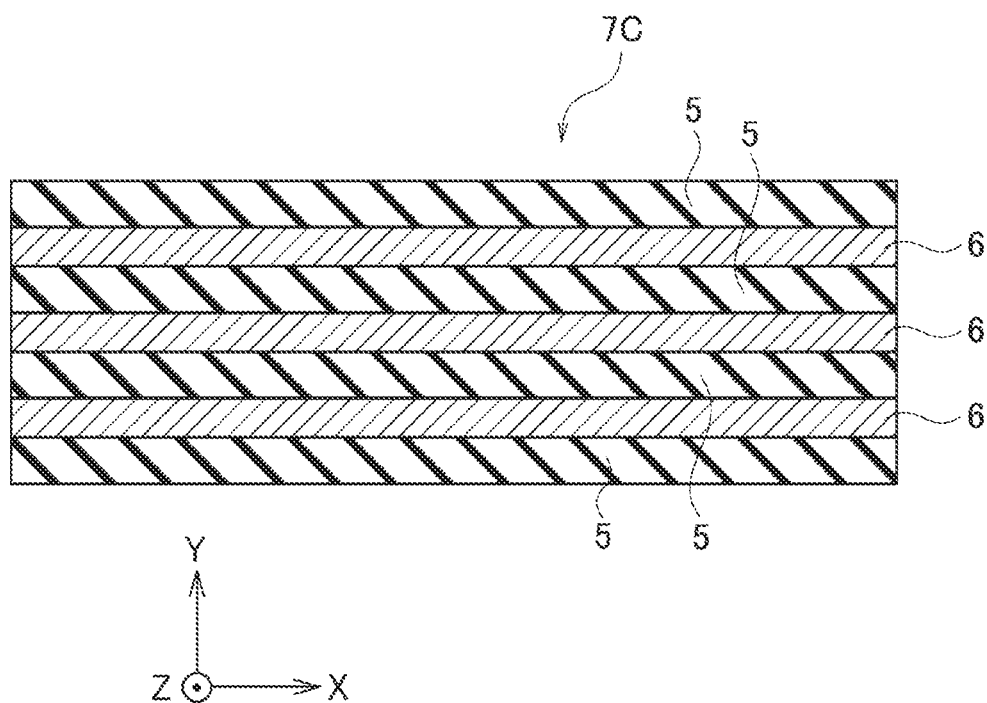
FIG. 9 is a plan view of a label component according to a Modification Example 1.

FIG. 9 is a plan view of a label component 7C according to Modification Example 1 of the embodiment.

As shown in FIG. 9, the label component 7C according to Modification Example 1 of the embodiment includes a plurality of high heat conductive members 6 and a plurality of low heat conductive members 5. The plurality of high heat conductive members 6 extend in the X direction. Further, the plurality of low heat conductive members 5 also extend in the X direction. As shown in FIG. 9, the plurality of high heat conductive members 6 and the plurality of low heat conductive members 5 are alternately disposed in the Y direction. Therefore, the label component 7C according to Modification Example 1 of the embodiment has high heat conduction quality in the X direction and low heat conduction quality in the Y direction.

Effects of Modification Example 1

In the label component 7C according to Modification Example 1 of the embodiment, by disposing the plurality of high heat conductive members and the plurality of low heat conductive members in parallel in a staggered manner, it is possible to have a characteristic that the heat conduction quality is high in the X direction and the heat conduction quality is low in the Y direction that is perpendicular to the X direction, and the directionality of the heat conduction can be controlled.

Modification Example 2

The high heat conductive member 6 does not have to be just one layer but may be multi-layered. Moreover, it is not necessary for all layers to have the same shape. A configuration may be adopted in which the high heat conductive member 6 has a multilayer structure and the size (or overlap range or coverage area) of the high heat conductive member 6 of each layer can be different.

Figure 10A:
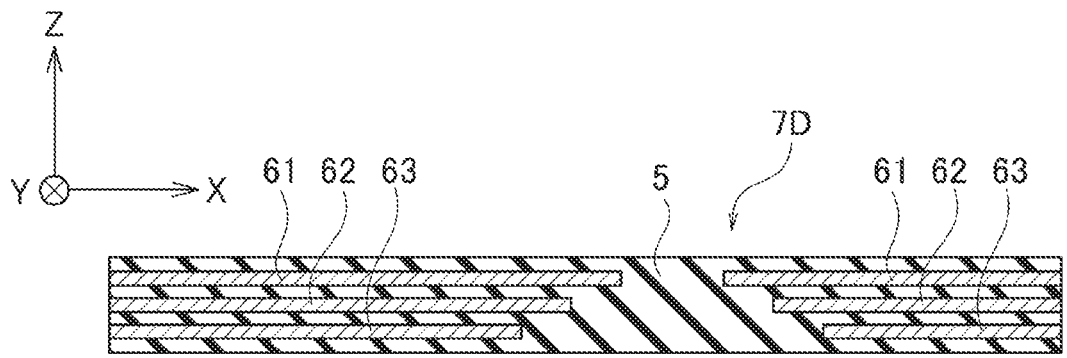
FIG. 10A is a cross-sectional view of a label component according to a Modification Example 2.

FIG. 10A is a cross-sectional view of a label component 7D according to Modification Example 2.

As shown in FIG. 10A, the label component 7D according to Modification Example 2 includes a plurality of high heat conductive members 61, 62, and 63 and also a low heat conductive member 5. As shown in FIG. 10A, the plurality of high heat conductive members 61, 62, and 63 are stacked with the low heat conductive member 5 being interposed between the adjacent layers in the Z direction. The low heat conductive member 5 is also disposed on the plus Z direction side of the high heat conductive member 61 and on the minus Z direction side of the high heat conductive member 63.

The plurality of high heat conductive members 61, 62, and 63 extend in the X direction (and similarly in Y direction). The plurality of high heat conductive members 61, 62, and 63 can have different lengths in the X direction, as shown in FIG. 10A.

Figure 10B:
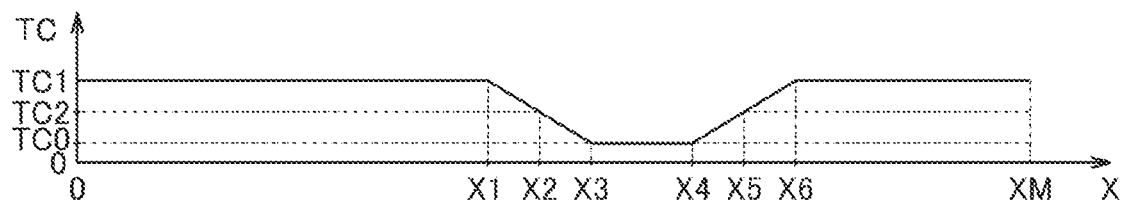
FIG. 10B depicts heat conductivity values for particular X-position locations corresponding to X-position locations in FIG. 10A.

FIG. 10B is a schematic view representing the distribution of the heat conductivity TC values for each location along the X direction corresponding to FIG. 10A.

In the label component 7D according to Modification Example 2, as shown in FIG. 10B, in a range of X=0 to X1 and X=X6 to XM where all three layers of the high heat conductive members (61, 62, and 63) are present, the heat conductivity TC=TC1. In a range of X1 to X2 and X5 to X6, where two layers of the high heat conductive members (61 and 62) are present, the heat conductivity TC is lower than TC1. At X2 and X5, heat conductivity TC=TC2. In a range of X2 to X3 and X4 to X5, where just one layer of the high heat conductive members (61) is present, the heat conductivity TC is further lowered. In a range of X3 to X4, where no high heat conductive member is present, the heat conductivity TC=TC0. The value of TC0 is even smaller than that of TC2.

Effects of Modification Example 2

In the label component 7D according to Modification Example 2, it is possible to adjust the distribution of the heat conductivity TC by individually adjusting the length, size, area, or placement of high heat conductive members that are stacked on each other.

Modification Example 3

Figure 11A:
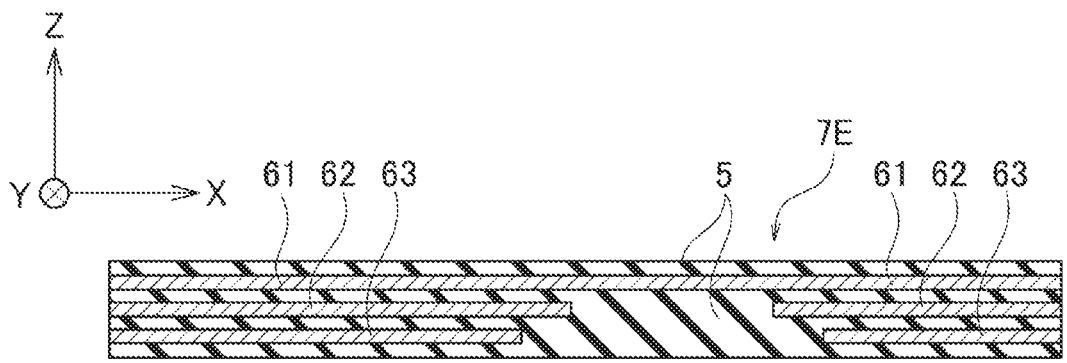
FIG. 11A is a cross-sectional view of a label component according to Modification Example 3.

FIG. 11A is a cross-sectional view of a label component 7E according to Modification Example 3.

As shown in FIG. 11A, the label component 7E according to Modification Example 3 includes a plurality of high heat conductive members 61, 62, and 63 and a low heat conductive member 5. As shown in FIG. 11A, the plurality of high heat conductive members 61, 62, and 63 are stacked with the low heat conductive member 5 interposed therebetween in the Z direction. The low heat conductive member 5 is also disposed on a plus Z direction side of the high heat conductive member 61 and a minus Z direction side of the high heat conductive member 63.

Further, the plurality of high heat conductive members 61, 62, and 63 extend in the X direction (and similarly in Y direction). The plurality of high heat conductive members 61, 62, and 63 have different lengths in the X direction as shown in FIG. 11A. The difference from Modification Example 2 is that the high heat conductive member 61 continuously extends in the X direction from X=0 to XM. Other configurations are the same as those of Modification Example 2.

Figure 11B:
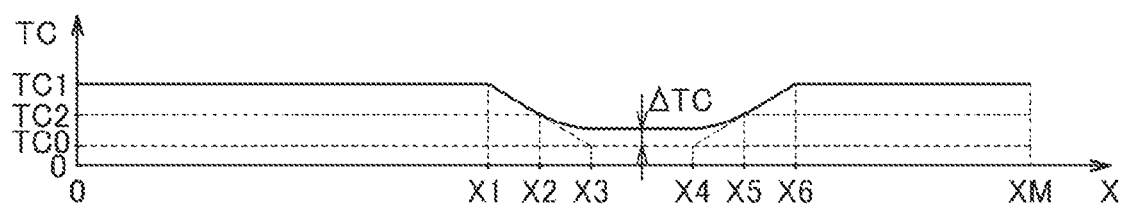
FIG. 11B depicts heat conductivity values for particular X-position locations corresponding to X-position locations in FIG. 11A.

FIG. 11B is a schematic view representing the distribution of the heat conductivity TC values for each location along the X direction corresponding to FIG. 11A.

In the label component 7E according to Modification Example 3, as shown in FIG. 11B, in a range of X=0 to X1 and X=X6 to XM, where all three layers of the high heat conductive members (61, 62, and 63) are present, the heat conductivity TC=TC1. In a range of X1 to X2 and X5 to X6, where two layers of the high heat conductive members (61 and 62) are present, the heat conductivity TC is lower than TC1. At X2 and X5, heat conductivity TC=TC2. In a range of X3 to X4, where just one layer of the high heat conductive member (61) is present, the heat conductivity TC is further lowered. In FIG. 11B, the heat conductivity TC depicted as the dashed line between X2 and X5 corresponds to the distribution of the heat conductivity TC in Modification Example 2, and the heat conductivity TC depicted as the solid line corresponds to the distribution of the heat conductivity TC in Modification Example 3. In a range of X3 to X4, where just the one layer of the high heat conductive member (61) is present, the heat conductivity TC of Modification Example 3 is increased by an amount ΔTC as compared with Modification Example 2.

Effects of Modification Example 3

In the label component 7E according to Modification Example 3, it is possible to adjust the distribution of the heat conductivity TC by adjusting the length, size, area, or placement of a plurality of high heat conductive members that are stacked on each other.

Configuration of Memory System

Figure 12:
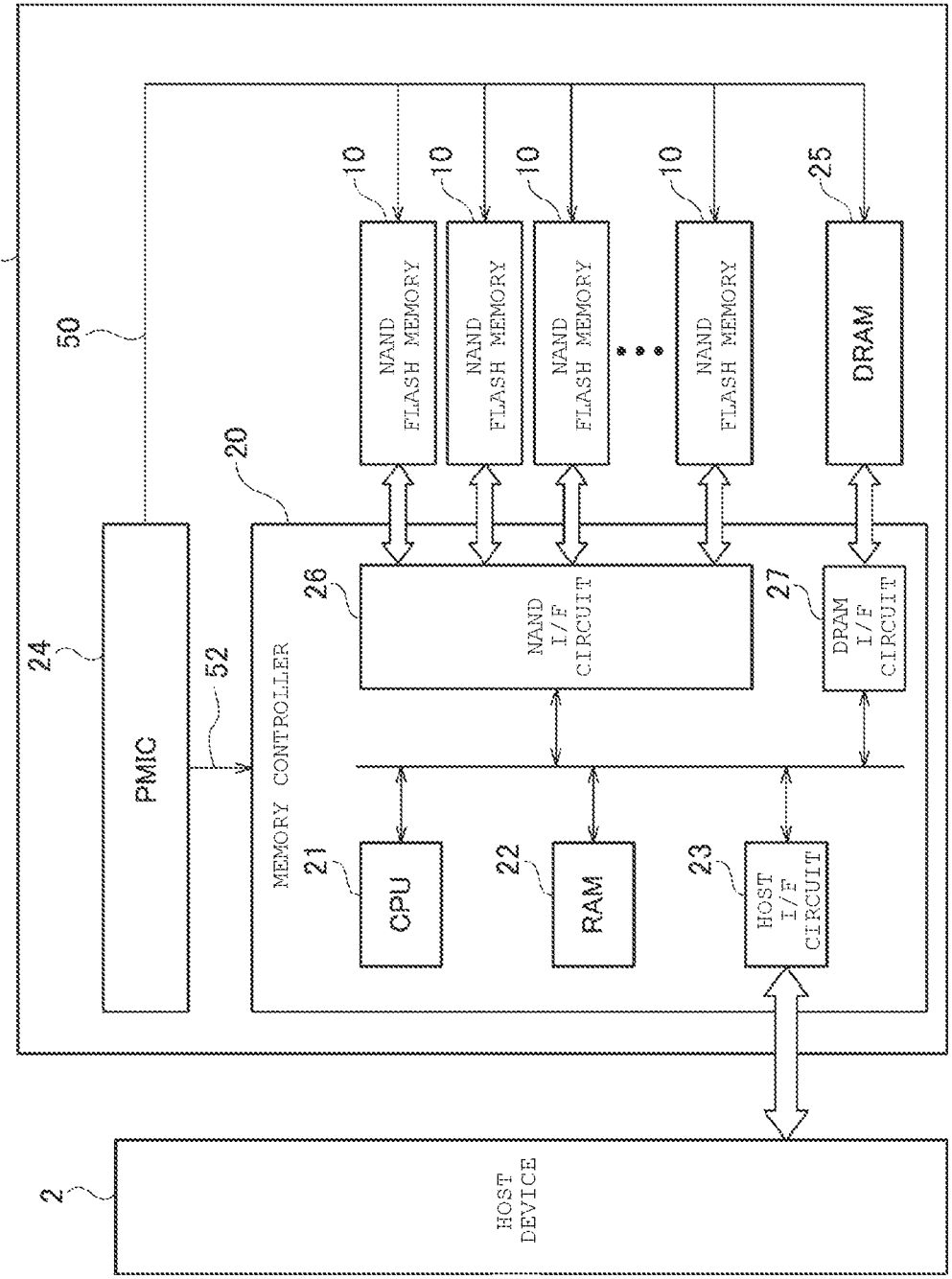
FIG. 12 is a block diagram of a memory system according to an embodiment.

FIG. 12 is a block diagram of the memory system 1 according to an embodiment. The memory system 1 is configured as an SSD. As shown in FIG. 12, the memory system 1 includes a plurality of NAND flash memory 10, a DRAM 25, a memory controller 20, and a PMIC 24. The memory system 1 may be connected to a host device 2.

The NAND flash memory 10 is a non-volatile memory that stores data non-volatilely and operates independently of each other. The number of NAND flash memories 10 is not particularly limited, and may be any number. The NAND flash memories 10 and the memory controller 20 are connected via a plurality of channels. As non-volatile memories other than NAND flash memory 10, a NOR type flash memory, a resistive random access memory (ReRAM), a phase-change memory (PCM), a ferroelectric random access memory (FeRAM), and a magneto tunnel junction (MTJ) resistance changing elements may be applied.

The DRAM 25 is a volatile memory that temporarily stores data. Regarding the number of volatile memories in the memory system 1 may be any number. The volatile memory is not limited to DRAM. For example, a static random access memory (SRAM) or the like may be used as a volatile memory.

The memory controller 20 may instruct the NAND flash memory 10 and the DRAM 25 to perform various operations. The memory controller 20 may execute operations based on an instruction from an external host device 2 or operations not based on an instruction from the host device 2 but rather internally generated (e.g., garbage collection operations or the like) by the memory controller 20.

The PMIC 24 supplies the necessary power to the memory controller 20 via a power supply line 52. The PMIC 24 supplies the necessary power to the NAND flash memory 10 and the DRAM 25 via a power supply line 50. The PMIC 24 includes, for example, a DC-DC converter, a low drop output (LDO) regulator, a switching regulator, and the like.

As shown in FIG. 12, the memory controller 20 includes, for example, a central processing unit (CPU) 21, a built-in memory (RAM: Random Access Memory) 22, a host I/F circuit 23, a NAND I/F circuit 26, and a DRAM I/F circuit 27. The configuration of the memory controller 20 is merely an example and is not limited thereto.

The CPU 21 controls the operation of the entire memory controller 20. For example, CPU 21 issues a read command in response to a read instruction received from the host device 2 and transmits the issued command to the NAND I/F circuit 26.

The built-in memory 22 is a storage area used as a work area of the CPU 21. For example, in the built-in memory 22, parameters for managing the NAND flash memory 10, various management tables, or the like are loaded. For example, the built-in memory 22 stores a queue (command queue) of instructions received from the host device 2. Further, the built-in memory 22 stores an address conversion table for converting the logical address associated with the data requested to be written by the host device 2 into the physical block address (PBA) of the NAND flash memory 10. This address conversion table is stored in, for example, the NAND flash memory 10, and is read out and loaded into the built-in memory 22 when the memory system 1 is started. As the built-in memory 22, for example, a volatile memory such as SRAM is used.

The host I/F circuit 23 is connected to the host device 2 and controls communication between the memory system 1 and the host device 2. For example, the host I/F circuit 23 controls the transfer of data, commands, and addresses between the memory system 1 and the host device 2. The host I/F circuit 23 supports communication I/F standards such as SATA, SAS, and PCIe (registered trademark). That is, examples of the host device 2 connected to the memory system 1 include a computer including an I/F circuit based on such as SATA, SAS, and PCIe, for example.

The NAND I/F circuit 26 is connected to the NAND flash memory 10 and controls the communication between the memory controller 20 and the NAND flash memory 10. The NAND I/F circuit 26 is configured based on the particular NAND I/F standard.

The DRAM I/F circuit 27 is connected to the DRAM 25 and controls communication between the memory controller 20 and the DRAM 25. The DRAM I/F circuit 27 is configured based on the particular DRAM I/F standard. The configuration of the DRAM I/F circuit 27 is not limited to this, but may be changed based on the type of volatile memory.

Electronic Device

Figure 13:
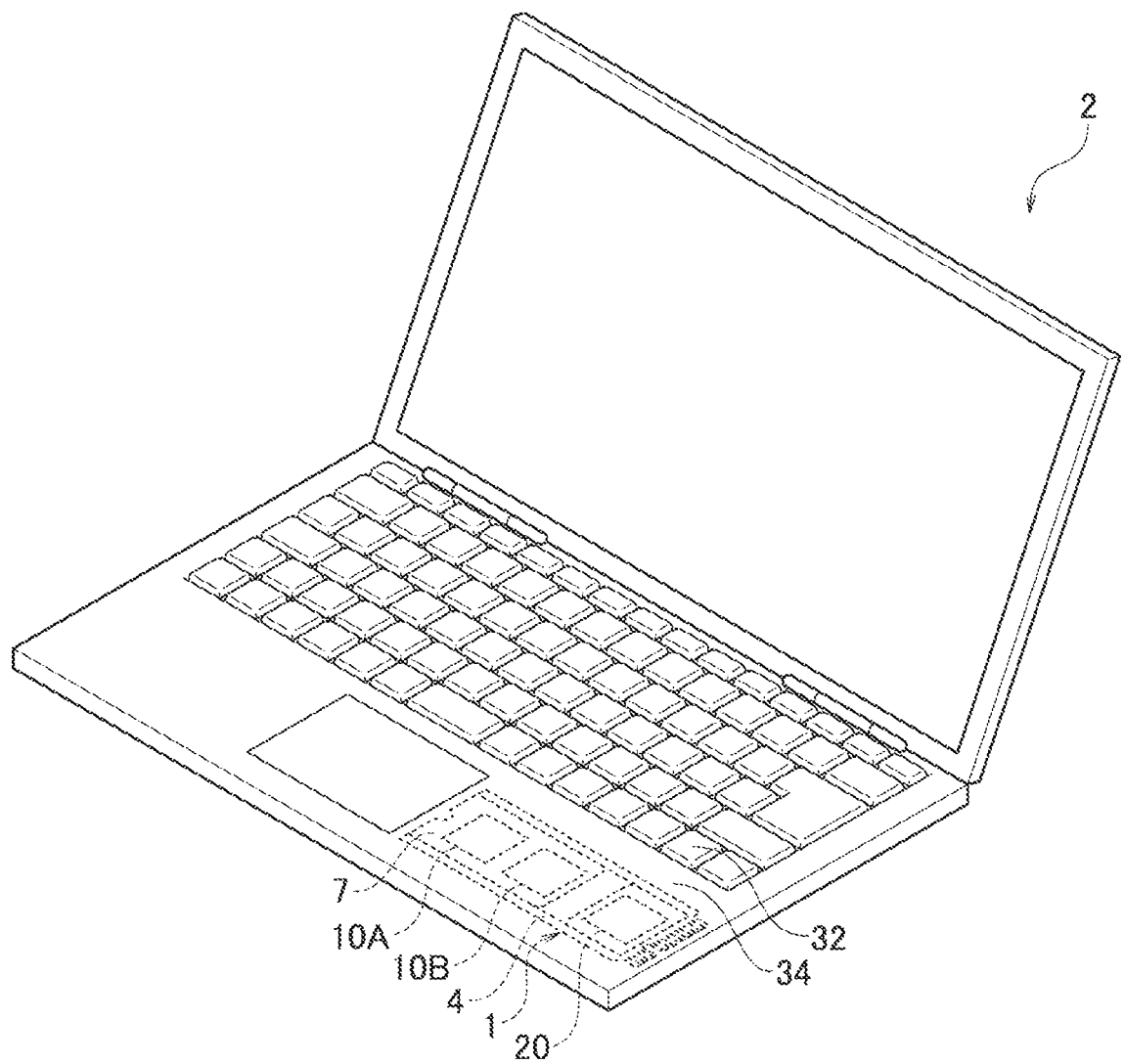
FIG. 13 is a perspective view of an electronic device in which a memory system according to an embodiment is mounted.

FIG. 13 is a perspective view showing an example of an electronic device 2. The electronic device 2 is an example of the host device 2 and is, for example, a personal computer. The memory system 1 is housed in an internal space under a palm rest 34 on the front side of the keyboard 32, for example. For example, NAND flash memories 10A and 10B and a memory controller 20 are mounted on the first substrate 4 of the memory system 1.

The electronic device 2 includes a memory system 1 that is interface-connected with the host device 2. The memory system 1 includes a first substrate 4, first electronic components 10A and 10B that are examples of first semiconductor devices, a second electronic component 20 that is an example of a second semiconductor device, and a label component 7. The first electronic components 10A and 10B are disposed on the first surface 4a side of the first substrate 4 and have a first operation allowable temperature. The second electronic component is disposed on the first surface 4a side of the first substrate 4 and has a second operation allowable temperature that is higher than the first operation allowable temperature. The label component 7 includes a first high heat conductive member that is an example of a first portion that diffuses heat generated by the first electronic components 10A and 10B, a second high heat conductive member that is an example of a second portion that diffuses heat generated by the second electronic component 20, and a low heat conductive member that is an example of a third portion that limits heat conduction between the first electronic components 10A and 10B and the second electronic component 20. The label component 7 is attached to the first substrate 4.

The heat generated by the memory controller 20 in the memory system 1 is transmitted via components of the electronic device 2 by the label component 7, and the heat can be discharged from a thermal exhaust port of the electronic device 2 in conjunction with air flow generated by a fan in the electronic device 2. As a result, the temperature of the NAND flash memories 10A and 10B can be maintained in a temperature range suitable for operation, and good operation of the electronic device 2 can be provided.

The layout of the NAND flash memories 10A and 10B and the memory controller 20 mounted on the first substrate 4 of the memory system 1 housed in the electronic device 2 is one example. This layout may be changed as appropriate according to the storage capacity required for the memory system 1 and the size of the available mounting space for the memory system 1 within the electronic device 2. A plurality of memory systems 1 may be housed in the electronic device 2. In general, any of the memory systems 1, 1A, 1B, 1C, 1D, and 1E according to the first to fifth embodiments described above may be applied to the memory system 1 housed in the electronic device 2. Further, as a label component, any or all of the label component 7 (FIGS. 1A and 1B) and the label components 7A, 7B, 7C, 7D, and 7E (FIGS. 6, 7, 8, 9, 10, 11) according to various modification examples may be used in combination.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A device, comprising:
   a first substrate;
   a first semiconductor device mounted on the first substrate;
   a second semiconductor device mounted on the first substrate, the first semiconductor device being spaced from the second semiconductor device in a first direction; and
   a label having a first portion corresponding in position to the first semiconductor device in a second direction, a second portion corresponding in position to the second semiconductor device in the second direction, and a third portion, the label being thermally connected to the first and second semiconductor devices, wherein the third portion has a first part and a second part,
the first part is between the first and second portions in the first direction, and
the first and second portions are in the second part in the second direction from the first substrate.

2. The device according to claim 1, wherein
the first portion has a first thermal conductivity,
the second portion has a second thermal conductivity, and
the third portion has a third thermal conductivity that is less than the first thermal conductivity and the second thermal conductivity.

3. The device according to claim 1, wherein
the first and second semiconductor devices are mounted on a first surface side of the first substrate,
the label is on the first surface side of the first substrate over the first and second semiconductor devices.

4. The device according to claim 1, wherein
the first and second semiconductor devices are mounted on a first surface side of the first substrate,
the label is on a second surface side of the first substrate, the second surface side being opposite to the first surface side, and
the first substrate is between the label and both the first and second semiconductor devices.

5. The device according to claim 1, wherein the first and second semiconductor devices are between the label and the first substrate.

6. The device according to claim 1, further comprising:
a housing; and
a metal screw connecting to the housing, wherein
the first portion is connected to the housing by the metal screw.

7. The device according to claim 1, further comprising:
a second substrate facing the first substrate with the label therebetween; and
a connector connecting the first substrate and the second substrate.

8. The device according to claim 1, wherein
the first substrate has a first end portion and a groove portion that is formed in the first end portion.

9. The device according to claim 8, further comprising:
a second substrate of a material different than the first substrate; and
a metal screw connecting the first substrate and the second substrate via the groove portion, wherein
the first portion is connected to the second substrate by the metal screw.

10. The device according to claim 9, wherein
the first substrate has a second end portion and a connector portion on the second end portion, and
the second portion is adjacent to the connector.

11. The device according to claim 1, wherein
the first semiconductor device is a NAND flash memory, and
the second semiconductor device is a memory controller configured to control the NAND flash memory.

12. The device according to claim 1, wherein
the first portion has a first thermal conductivity,
the second portion has a second thermal conductivity that is less than the first thermal conductivity, and
the third portion has a third thermal conductivity that is less than the first thermal conductivity and the second thermal conductivity.

13. The device according to claim 1, wherein the first portion comprises a plurality of metal film layers stacked in a thickness direction of the label with insulating material between each pair of adjacent metal film layers.

14. The device according to claim 13, wherein each end of the metal film layers in the first direction is aligned with each other in the thickness direction.

15. A label for electronic devices with multiple components mounted to a substrate, the label comprising:
a first portion in a first area for a first component;
a second portion in a second area for a second component, the second area spaced from the first area in a first direction; and
a third portion, the third portion limiting heat conduction between the first portion and the second portion, wherein
the third portion has a first part and a second part,
the first part is between the first and second portions in the first direction, and
the first and second portions are embedded in the second part.

16. The label according to claim 15, wherein
the first portion has a first thermal conductivity,
the second portion has a second thermal conductivity, and
the third portion has a third thermal conductivity that is less than the first thermal conductivity and the second thermal conductivity.

17. The label according to claim 15, wherein
the first portion comprises a first plurality of metal film layers stacked in a thickness direction of the label with insulating material between each pair of adjacent metal film layers among the first plurality of metal film layers, and
the second portion comprises a second plurality of metal film layers stacked in the thickness direction with insulating material between each pair of adjacent metal film layers among the second plurality of metal film layers.

18. The label according to claim 15, wherein
the first portion comprises a first metal film layer, and
the second portion comprises a second metal film layer.

19. A memory system, comprising:
a housing;
a printed circuit board in the housing;
a NAND flash memory device mounted on the printed circuit board in a first area;
a memory controller mounted on the printed circuit board in a second area spaced from the first area;
a label having a first metal layer portion corresponding in position to the NAND flash memory device, a second metal layer portion corresponding in position to the memory controller, and a third portion between the first metal layer portion and the second metal layer portion; and
a metal connector thermally connecting the label to the housing.

20. The memory system according to claim 19, wherein the metal connector is a screw.

* * * * *